United States Patent
Kaifu et al.

(10) Patent No.: US 7,393,791 B2
(45) Date of Patent: Jul. 1, 2008

(54) ETCHING METHOD, METHOD OF FABRICATING METAL FILM STRUCTURE, AND ETCHING STRUCTURE

(75) Inventors: Katsuaki Kaifu, Tokyo (JP); Juro Mita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 30 days.

(21) Appl. No.: 11/512,341

(22) Filed: Aug. 30, 2006

(65) Prior Publication Data

US 2007/0049031 A1  Mar. 1, 2007

(30) Foreign Application Priority Data

Aug. 30, 2005  (JP) .............................. 2005-248804

(51) Int. Cl.
*H01L 21/302* (2006.01)
(52) U.S. Cl. ................ 438/700; 438/701; 438/713; 438/724; 438/725; 438/744
(58) Field of Classification Search ................ 438/700, 438/701, 713, 724, 725, 744
See application file for complete search history.

(56) References Cited

U.S. PATENT DOCUMENTS

| 6,204,102 B1 * | 3/2001 | Yoon et al. ................. 438/182 |
| 6,444,588 B1 * | 9/2002 | Holscher et al. ............ 438/737 |
| 6,458,603 B1 * | 10/2002 | Kersch et al. ................. 438/3 |
| 6,645,819 B2 * | 11/2003 | Pullela ....................... 438/319 |
| 2003/0203583 A1 * | 10/2003 | Malik ......................... 438/312 |
| 2005/0017364 A1 | 1/2005 | Iba |
| 2006/0046446 A1 * | 3/2006 | Kon et al. ................... 438/579 |
| 2006/0223245 A9 * | 10/2006 | Pellens et al. ............... 438/167 |

FOREIGN PATENT DOCUMENTS

JP  2005-045176  2/2005

\* cited by examiner

*Primary Examiner*—Binh X. Tran
(74) *Attorney, Agent, or Firm*—Rabin & Berdo, P.C.

(57) ABSTRACT

There is provided an etching method in which a protective film existing in an etching-destined region of a substrate structure is removed by means of ICP-RIE to form an exposure region of the principal surface of the substrate. The substrate structure comprises a substrate, a protective film formed on the substrate, a photoresist layer formed on the protective film, and a hole formed throughout the photoresist layer. The hole comprises an opening formed in the photoresist layer surface and a hollow linked to the opening in the thickness direction of the photoresist layer and reaching the protective film. ICP-RIE is performed under conditions such that (1) ICP power is 20 to 100 W, (2) RIE power is 5 to 50 W, and (3) the pressure in the etching chamber is 1 to 100 mTorr.

18 Claims, 5 Drawing Sheets

328nm

ETCHING METHOD, METHOD OF FABRICATING METAL FILM STRUCTURE, AND ETCHING STRUCTURE

BACKGROUND OF THE INVENTION

1. Field of the Invention

The present invention relates to an etching method that is mainly used in the fabrication of semiconductor devices, a process of fabricating a metal film structure that employs the etching method, and an etching structure that is obtained by the etching method.

2. Description of Related Art

Generally, metal electrodes used in semiconductor devices comprising compound semiconductors are formed by means of the lift-off method.

That is, a photoresist pattern is formed on the principal surface of a substrate having the elements formed thereon. The photoresist pattern has provided therethrough an opening of the same shape as the planar shape of the metal electrode to be formed. Further, a metal of the electrode material is deposited by means of vacuum deposition or the like on all over the surface of the photoresist pattern including the opening. Thereafter, a metal electrode having a predetermined planar shape is residually formed through removal (lift-off) of unused metal film deposited in a region excluding the opening together with the photoresist.

Further, in compound semiconductor devices, a protective film comprising a silicon nitride film or silicon oxide film or the like is frequently formed on the principal surface of the substrate where the elements exist. The protective film serves to protect the elements from contamination and suppress the production of surface charge.

Therefore, when forming a metal electrode in a semiconductor device with a protective film, the protective film is required to be removed.

The process of forming a metal electrode of a conventional commonly known semiconductor device with a protective film will be described hereinbelow with reference to FIGS. 5A to 5E.

First, as shown in FIG. 5A, a substrate 102 having formed on its surface a protective film 100 is prepared.

The structure shown in FIG. 5B is then formed as follows. A photoresist is applied onto the protective film 100. Thereafter, by performing exposure and development, the photoresist layer 104 is removed at its portion where a metal electrode 112 is to be formed. The portion is a planned electrode formation region 102c of the photoresist. As a result, a hole 106 that reaches the protective film 100 is formed in the photoresist layer 104. Here, the opening in the surface of the photoresist layer 104 of the hole 106 is shown by a reference numeral 106a. Further, the planned electrode formation region 102c represents a region with the same planar shape as the opening 106a on the principal surface 102a of the substrate 102.

The structure shown in FIG. 5C is formed next. That is, the exposed portion of the protective film is etched by means of the RIE (reactive ion etching) method with the photoresist layer 104 serving as a mask. By the way, in the etching process, a component of the plasma particles penetrating the interior of the hole 106, flies obliquely toward the principal surface 102a of the substrate 102. Accordingly, the plasma particles strike onto the surface of the protective film 100 over a wider region than the planned electrode formation region 102c. As a result, the protective film 100 is removed through side etching from not only the region corresponding with the planned electrode formation region 102c but also as far as the peripheral region. As a result, within the hole 106, the protective film 100 is removed to form an exposure region 108 via which the principal surface 102a of the substrate 102 is exposed. For the reason provided above, the exposure region 108 has a larger surface area than that of the planned electrode formation region 102c.

Thereafter, the structure shown in FIG. 5D is formed. That is, a metal film 110 is deposited through vacuum deposition over the whole face on the side of the principal surface 102a in a state where the photoresist layer 104 still remains as shown in FIG. 5C. Further, metal atoms that fly from the evaporation source have stronger directivity than the plasma particles mentioned earlier. Accordingly, the metal atoms that penetrate inside the hole 106 after passing through the opening 106a are deposited on a limited region of the exposure region 108. Specifically, metal atoms are not deposited over the whole of the exposure region 108 but are rather deposited in a cross-sectional trapezoidal shape in a slightly wider region than the planned electrode formation region 102c. Here, the metal film that is deposited in the planned electrode formation region 102c is shown by a reference numeral 110a. Further, the metal film that is deposited on the photoresist layer 104 is shown by a reference numeral 110b.

Finally, the metal electrode 112 (metal film 110a) shown in FIG. 5E is obtained. That is, unnecessary portion to the metal film 110b on the photoresist layer 104 is removed by dissolving the photoresist layer 104 by means of an organic solvent or the like.

As shown in FIG. 5E, an uncoated region 114 via which the principal surface 102a of the substrate 102 is exposed exists between the metal electrode 112 and the protective film 100 that surrounds the metal electrode 112. This is because, as shown in FIG. 5C, excessive side etching occurs as a result of etching performed by means of the RIE method and hence the protective film 100 is removed over a wider region (exposure region 108) than the planned electrode formation region 102c.

The uncoated region 114 is not coated by the protective film 100 or metal electrode 112 and is therefore readily contaminated, which causes the production of surface charge.

Hence, a technique that does not allow the uncoated region 114 to be produced, that is, a technique that suppresses side etching of the protective film 100 (FIG. 5C) is desirable.

According to the technique, a porous silica film is changed to a hardly etchable film by exposing the side of the to be etched film comprising the porous silica film by means of hydrogen plasma. A conventional technique for suppressing side etching is known from Japanese Laid-Open Patent Application No. 2005-45176 (corresponding to U.S. Patent Application Publication No. US 2005/0017364 A1).

However, the conventional technique necessitates additional hydrogen plasma processing in order to suppress the side etching of the porous silica film. By this reason, the conventional technique has the problem that the number of steps of the etching processing increases.

SUMMARY OF THE INVENTION

The present invention was conceived in view of such problem. Therefore, an object of the present invention is to provide an etching method that allows side etching of the etched film to be suppressed without increasing the number of steps, a process of fabricating a metal film structure that utilizes the etching method, and an etching structure that is formed by the etching method.

In order to solve the above problem, the etching method of the present invention involves using inductively coupled plasma reactive ion etching to remove a portion of a to be etched film that exists in an etching-destined region of a to be etched film in the substrate structure and forming an exposure region via which the principal surface of the substrate is exposed.

That is, the substrate structure comprises a substrate, a to be etched film that covers the principal surface of the substrate, and an etching protection film that covers the to be etched film and in which a hole is formed.

The hole is formed by an opening that is formed in the surface of the etching protection film and a hollow that is linked to the opening in the thickness direction of the etching protection film and reaches the to be etched film.

The planar shape of the opening is congruous to the planar shape of the etching-destined region of the to be etched film. Further, the hole has a hole width that widens toward the to be etched film in the depth direction from the surface of the etching protection film.

Here, the inductively coupled plasma reactive ion etching is performed under the following conditions: (1) ICP power has a value in the range of 20 to 100 W, (2) RIE power has a value in the range of 5 to 50 W, and (3) the pressure in the etching chamber has a value in the range of 1 to 100 mTorr.

In the above etching method, it is preferable that a substrate having a GaN layer on the principal surface side thereof be used as the substrate, a silicon nitride film be used as the to be etched film, a negative-type photoresist be used as the etching protection film, and $SF_6$ be used as the etching gas of the inductively coupled plasma reactive ion etching.

In inductively coupled plasma reactive ion etching, the ICP power suitably has a value in the range of 30 to 80 W. In addition, the ICP power more suitably has a value in the range of 40 to 60 W.

In inductively coupled plasma reactive ion etching, the RIE power suitably has a value in the range of 10 to 30 W. In addition, the RIE power more suitably has a value in the range of 15 to 20 W.

In inductively coupled plasma reactive ion etching, the pressure in the etching chamber suitably has a value within the range of 7.5 to 15 mTorr.

The temperature of the substrate during implementation of the inductively coupled plasma reactive ion etching is suitably set to a temperature at which the etching protection film is not thermally deformed. This temperature preferably has a value in the range of 25 to 80° C., for example.

When the to be etched film part is removed, the etching time of the inductively coupled plasma reactive ion etching is preferably a time permitting removal of a film thickness corresponding to 1.5 times the film thickness of the to be etched film.

The width of the interval between the etching-destined region and the exposure region is preferably no more than 0.1 µm.

A substrate obtained by forming the GaN layer on a sapphire substrate is preferably used as the substrate.

The method of fabricating a metal film structure of the present invention utilizes the above etching method and comprises the steps of, after forming the exposure region, depositing a metal film by means of vacuum deposition in a region on the side of the principal surface of the substrate comprising the exposure region, with the etching protection film serving as a mask; and removing a metal film part that exists outside the hole of the metal film together with the etching protection film.

In the step of depositing the metal film, the substrate is preferably rotated eccentrically with respect to the evaporation source that causes the source material of the metal film to evaporate.

The metal film is preferably deposited in the exposure region such that the metal film partially overlaps the surface of the to be etched film in the periphery of the exposure region, in the hole.

In the vacuum deposition, metal atoms constituting the metal film are preferably made to fly to the exposure region via the opening with a higher directivity than the plasma particles of the inductively coupled plasma reactive ion etching.

The metal film is preferably formed as a stacked film obtained by depositing an Ni film and an Au film, in that order.

When the metal film part that exists outside the hole of the metal film is removed together with the etching protection film, the substrate on the principal surface side of which the metal film is deposited is preferably immersed in a solvent that dissolves the etching protection film.

The etching structure of the present invention is formed by etching and comprises: a substrate; a to be etched film that covers the principal surface of the substrate; an exposure region in which the to be etched film is removed and the principal surface of the substrate is exposed; a peripheral region constituting a region of the to be etched film and obtained by excluding the exposure region from a region that is rendered by analogously enlarging the planar shape of the exposure region; and a flat region constituting a region of the to be etched film that is a region other than the region comprising the exposure region and the peripheral region.

Further, the film thickness of the to be etched film increases as the distance from the exposure region increases such that the inclination of the outline of the cross-section of the to be etched film that exists in the peripheral region decreases as the distance from the exposure region increases; and the to be etched film is provided with a side wall that extends perpendicularly to the principal surface at a boundary between the peripheral region and the flat region.

The height of the side wall in a direction perpendicular to the principal surface is preferably at least 50 nm.

According to the etching method of the present invention, plasma particles are bombarded or struck substantially perpendicularly to the principal surface of the substrate by performing inductively coupled plasma reactive ion etching (referred to hereinbelow as 'ICP-RIE') of the to be etched film under predetermined conditions. As a result, an exposure region with a planar shape that is congruent to the opening or the etching-destined region is obtained. That is, side etching of the to be etched film is suppressed in comparison with conventional technology by performing ICP-RIE under these conditions.

Further, a minute quantity of plasma particles is bombarded onto the peripheral region of the etching-destined region. The etching-destined region is also designated as a region to be etched. The quantity of plasma particles irradiated onto the peripheral region grows smaller as the distance from the etching-destined region increases. As a result, the to be etched film that exists in the peripheral region slowly increases in film thickness with increased separation from the exposure region. Specifically, at the boundary between the exposure region via which the principal surface is exposed and the peripheral region where a to be etched film remains, the side of the to be etched film is not formed perpendicularly with respect to the exposure region and is formed as an oblique face whose inclination is gradually reduced with increased separation from the exposure region.

Further, the method of fabricating the metal film structure of the present invention allows the whole area of the exposure region to be coated by the metal film structure. That is, the metal atoms flying from the vacuum deposition evaporation source to the substrate include not only the metal atoms that fly perpendicularly to the principal surface but also those metal atoms that fly obliquely to the principal surface. Accordingly, atoms that arrive inside the hole after passing through the opening are deposited not only in the exposure region with a planar shape congruent to the opening but also onto a portion of the to be etched film that exists in the peripheral region. As a result, the whole area of the exposure region is coated by the metal film structure.

Further, as mentioned earlier, in the peripheral region, the side of the to be etched film is formed as an oblique face the inclination of which gradually varies. In other words, at the boundary between the exposure region and peripheral region, the variation of discontinuous height, that is, the step-like variation is suppressed. Accordingly, a so-called step disconnection is not produced in the metal film structure deposited at the boundary.

In addition, according to the etching structure of the present invention, the inclination of the outline of the cross-section of the to be etched film is formed in the peripheral region so as to decrease in accordance with the distance from the exposure region. That is to say, a step-like level difference does not exist at the boundary between the exposure region and the peripheral region. As a result, when a metal film is deposited in the exposure region to coat a portion of the peripheral region, a so-called step disconnection is not produced at the boundary between the exposure region and peripheral region.

In summary of the above, the present invention is able to provide an etching method that allows side etching of the to be etched film to be suppressed without increasing the number of steps, a method of fabricating a metal film structure that utilizes the etching method, and an etching structure that is formed by the etching method.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

An embodiment of the present invention will be described hereinbelow with reference to the drawings. Each of the drawings shows the shape, size and dispositional relationship of each of the constituent elements only schematically to an extent permitting an understanding of the present invention. Further, although preferred constitutional examples of the present invention will be described hereinbelow, the materials and numerical conditions of the respective constituent elements are merely preferred examples. Hence, the present invention is not in any way limited to the following embodiment.

First Embodiment

A preferred embodiment of an etching method, a method of fabricating a metal film structure and an etching structure of a first embodiment will now be described with reference to FIGS. 1 to 4.

First, explanation will be given to preferred embodiments of an etching method and a process of fabricating a metal film structure.

First Step

Figure 1A:
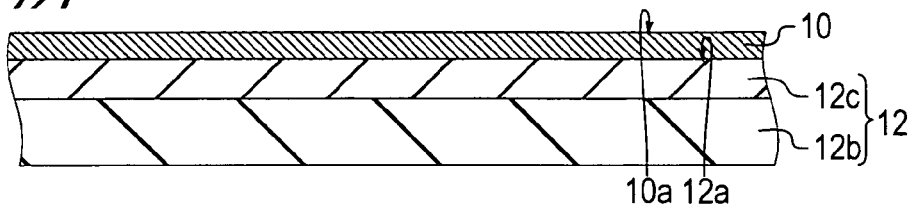
FIG. 1A is a view schematically showing a cross section of a structure obtained at a first step of the etching method of a first embodiment according to the invention.

As shown in FIG. 1A, a substrate 12 the principal surface 12a of which is coated by a protective film 10 constituting a to be etched film is first prepared.

Here, the substrate 12 is preferably a stacked substrate obtained by depositing a GaN layer 12c that is approximately 3 μm thick on a sapphire substrate 12b, for example. The substrate 12 has elements such as transistors provided on the side of the principal surface 12a of the GaN layer 12c. Further, an illustration of these elements is omitted in the drawings.

The protective film 10 is preferably a silicon nitride film approximately 100 nm thick, for example. The silicon nitride film is preferably formed by plasma CVD (plasma chemical vapor deposition), for example.

Second Step

Figure 1B:
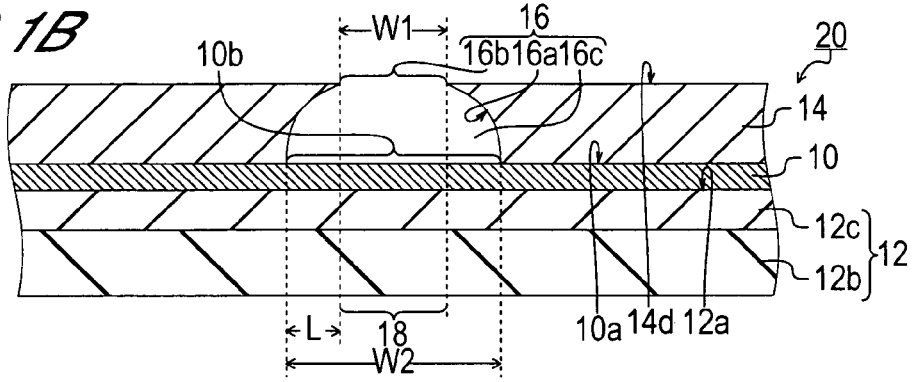
FIG. 1B is a view schematically showing a cross section of a structure obtained at a second step of the etching method of the first embodiment.

Thereafter, the substrate structure 20 shown in FIG. 1B is formed. Specifically, photoresist is applied by means of spin-coating to the whole of the surface 10a of the protective film 10 to form a photoresist layer 14 constituting an etching protection film. Thereafter, the photoresist layer 14 is pre-baked for approximately 20 minutes with a substrate temperature of approximately 65° C. Subsequently, UV light with a wavelength longer than that of exposure light (described subsequently) (wavelength: approximately 400 nm) is irradiated onto the whole face of the photoresist layer 14. Thereafter, exposure through contact exposure is performed by irradiating deep-UV light constituting exposure light (wavelength: approximately 250 nm) and the planar shape of the hole 16 is transferred to the photoresist layer 14. Further, post-exposure baking is performed for approximately 20 minutes with a substrate temperature of approximately 100° C. Finally, development in a commonly known developing solution is performed and the part of the photoresist layer 14 that is soluble in development solution is removed. The hole 16 is thus formed.

The hole 16 that is formed in this way is formed by an opening 16b and a hollow 16c that is linked to the opening 16b.

The opening 16b is provided on an upper surface 14d of the photoresist layer 14 and connects the internal space, namely, hollow 16c of the hole 16 with an external space.

The hollow 16c is a space that is linked to the opening 16b in the thickness direction of the photoresist layer 14. The hollow is surrounded by exposed protective film 10 (referred to as the 'protective film exposed region 10b' hereinbelow) and a side 16a.

The hole 16 gradually widens at increasing depth from the upper surface 14d of the photoresist layer 14. That is, the width within a plane parallel to the principal surface 12a of the substrate 12 of the hollow 16c (width in a horizontal direction in the drawings) gradually widens in step with increase in the depth from the upper surface 14d. That is, the side 16a of the hole 16 is formed so as to extend in the shape of a canopy in the space above the protective film exposed region 10b. In other words, side 16a is formed in a so-called overhang shape. As a result, the area of the protective film exposed region 10b is larger than that of the opening 16b.

Here, the region provided through orthogonal projection with respect to the protective film exposed region 10b of the opening 16b is known as the etching-destined region 18. That is, the planar shape of the etching-destined region 18 is congruent to that of the opening 16b.

Here, the thickness of the photoresist layer 14 is preferably approximately 1 µm, for example. Further, the width W1 in a plane parallel to the principal surface 12a of the substrate 12 of the opening 16b is preferably also approximately 1 µm, for example. In addition, the width L of the overhang of the side 16a, that is, the half value of the difference between width W2 of the protective film exposed region 10b within a plane parallel to the principal surface 12a of the substrate 12 and width W1 of the opening 16b, also varies in accordance with the development conditions. Here, width L is preferably approximately 0.5 µm, for example.

Further, a negative-type photoresist (trade name: LMR-F33 (Fuji Medical Co.) is used as photoresist layer 14 in order to form overhang-shaped side 16a in hole 16.

When the negative-type photoresist is irradiated with exposure light, the irradiated part thereof becomes insoluble. Further, the exposure light is absorbed by resist molecules during transmitting of the light via the photoresist layer 14 in the thickness direction and accordingly the intensity of the light gradually decreases together with depth. That is, the intensity of the arriving exposure light decreases with increasing depth from the upper surface 14d of the photoresist layer 14. Accordingly, the degree of insolubility of the photoresist layer 14 is reduced with increasing depth from the upper surface 14d. In other words, the photoresist layer 14 is readily soluble in developing solution with increasing depth from the upper surface 14d. As a result, through development, the hollow 16c widens with increasing depth from the upper surface 14d, whereby the overhang-shaped side 16a is formed.

Third Step

Figure 1C:
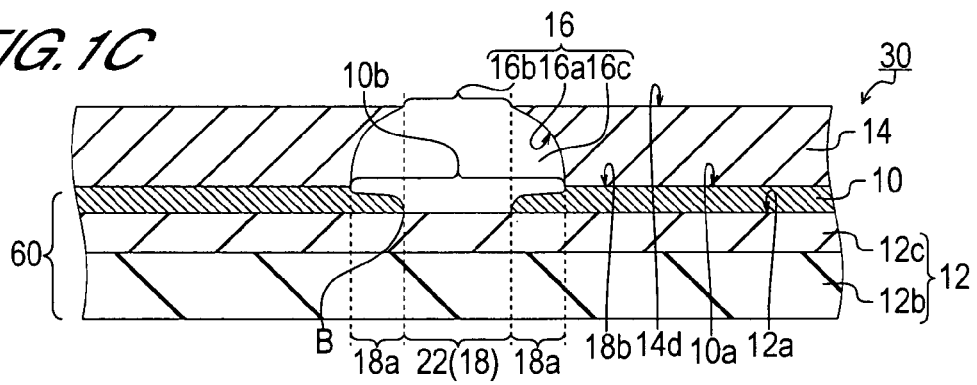
FIG. 1C is a view schematically showing a cross section of a structure obtained at a third step of the etching method of the first embodiment.

Thereafter, the structure 30 shown in FIG. 1C is formed. Specifically, by exposing the substrate structure 20 to ICP-RIE with the photoresist layer 14 serving as a mask, a part of the protective film 10 that exists in the etching-destined region 18 is removed to form an exposure region 22 in which the principal surface 12a of the substrate 12 is exposed.

When ICP-RIE was performed, $SF_6$ gas was used as the etching gas. Here, the flow rate of $SF_6$ gas was approximately 10 sccm. Further, the pressure in the etching chamber was approximately 7.5 mTorr. Furthermore, the ICP power was approximately 50 W and the RIE power was approximately 15 W. The temperature of the substrate 12 during the etching was approximately 40° C.

In this embodiment, etching was performed in an etching time in which a film thickness (approximately 150 nm) corresponding to 1.5 times that of the protective film 10 (film thickness: approximately 100 nm) is removed. This served to achieve reliable removal of the protective film 10. More specifically, the etching time set approximately 3.75 (min) (=150/40) based on a silicon-nitride (protective film 10) etching rate (approximately 40 nm/min) that was found from prior experimentation.

By performing etching under these conditions, the protective film 10 of the etching-destined region 18 is removed and an exposure region 22 with a planar shape that is congruent to the opening 16b is formed.

Here, 'congruent' indicates a substantial match between the planar shape of the exposure region 22 and the orthogonal projection of the opening 16b with respect to the principal surface 12a when the etching ends. Further, 'substantial match' indicates that, when the protective film 110 is overetched 50% through film thickness conversion as per this embodiment, the interval between the orthogonal projection of the opening 16b and the exposure region 22 (larger area than orthogonal projection) is no more than 0.1 µm.

Further, the unit 'sccm' for the flow rate of $SF_6$ gas indicates a gas flow rate $cm^3/min$ converted to a temperature of 0° C. and an atmospheric pressure of 101325 Pa.

Furthermore, ICP power denotes the power that is applied to a high frequency power supply for generating plasma and relates to the amount of plasma particles generated in the etching chamber. In addition, the RIE power indicates the power applied to the high frequency power supply for drawing the plasma particles to the substrate structure 20 and relates to the incident energy of the plasma particles with respect to the protective film 10, that is, the plasma sheath potential.

Figure 2:
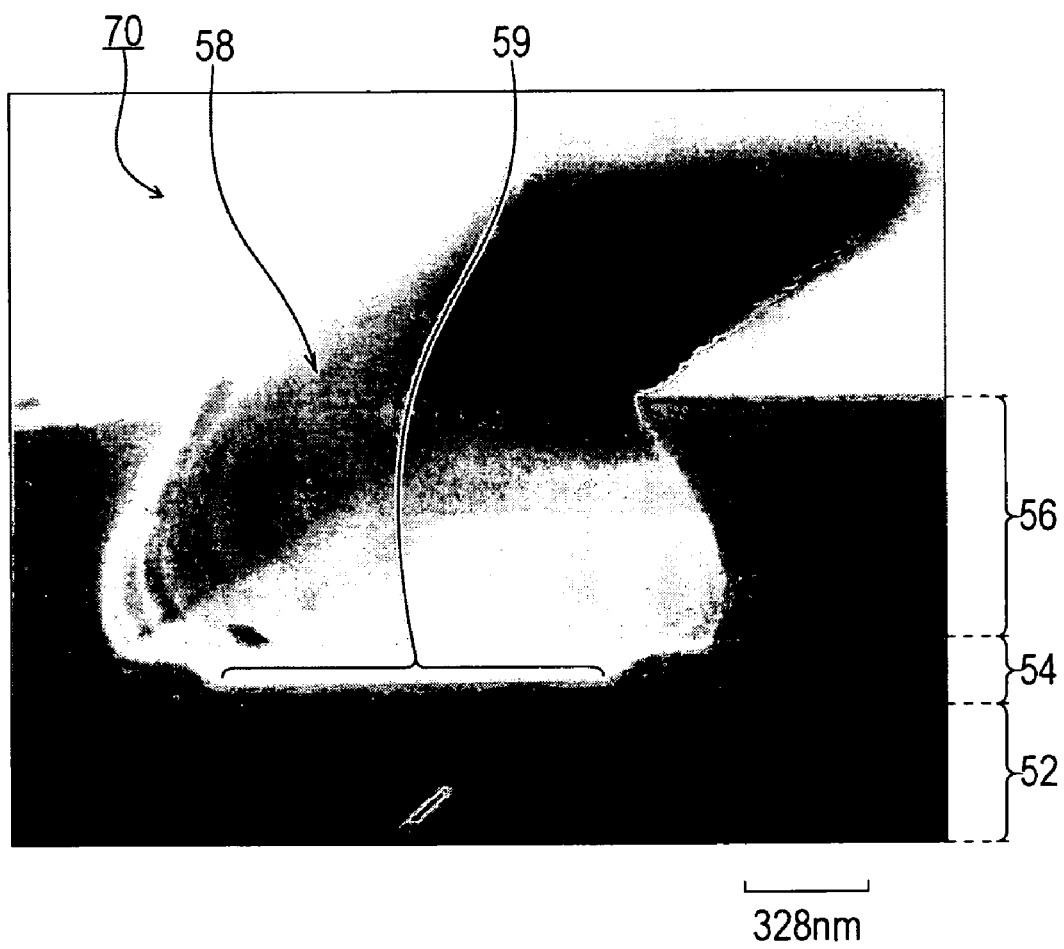
FIG. 2 is a view showing a cross-section SEM photograph of a structure obtained at the third step of the first embodiment.

Here, it is shown with reference to the SEM photograph of FIG. 2 that a planar exposure region 22 that is congruent to the opening 16b is obtained by means of ICP-RIE of predetermined conditions.

The structure 70 shown in FIG. 2 is an example of a sample that the present inventors fabricated in the process leading to arrival at the completion of the invention. Therefore, the stacked structure of the structure 70 differs slightly from that of the substrate structure 20 mentioned earlier. However, because the basic stacked structure of the structure 70 and substrate structure 20 is common, the discussion provided hereinbelow is also valid for the substrate structure 20.

The structure 70 comprises a substrate 52, a protective film 54, and a photoresist 56.

The substrate 52 is a sapphire substrate. The protective film 54, which comprises silicon nitride with a thickness of approximately 100 nm, is deposited on the sapphire substrate 52. The photoresist 56, which is the same as that used in the above embodiment, is applied with a thickness of approximately 0.5 µm onto the protective film 54.

Further, exposure and development of the photoresist 56 were performed as per the aforementioned second step to form a hole 58 with an opening width of approximately 1 µm. Thereafter, with the exception of the two minute etching time, ICP-RIE was performed under the same etching conditions as in the aforementioned third step, whereby the protective film 54 was removed.

As a result, as shown in FIG. 2, an exposure region 59 of a shape substantially congruent to that of the hole 58, that is, having a width substantially equal to the opening width of the hole 58, was obtained.

The cross-sectional structure of the structure 30 in the vicinity of the external perimeter of the etching-destined region, namely, the region to be etched 18 will now be described in detail next with reference to FIG. 3.

Figure 3:
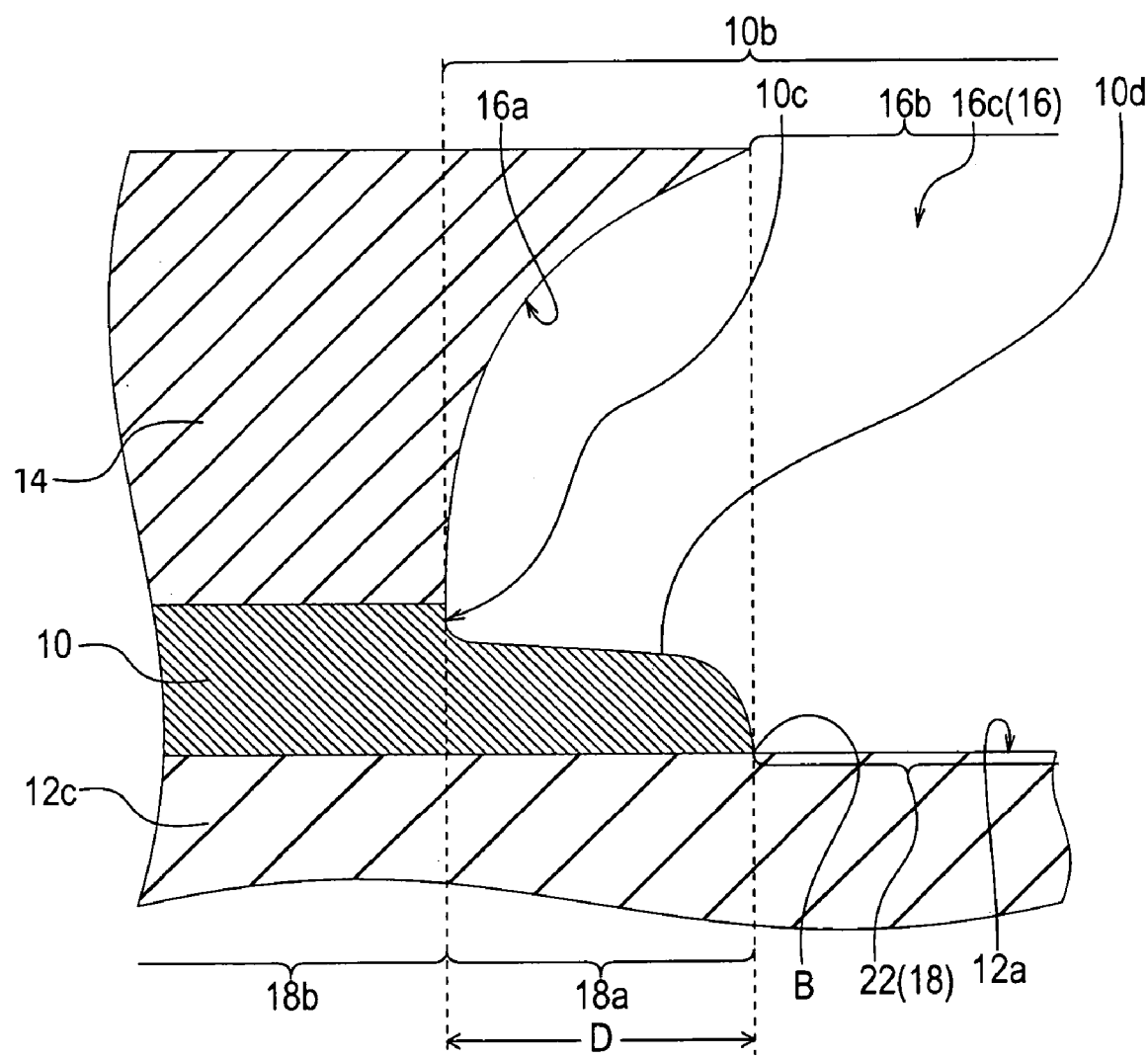
FIG. 3 is a view schematically showing a cross section in the vicinity of the outer perimeter of an etching-destined region of a structure obtained at the third step of the first embodiment.

With reference to FIG. 3, the planar shapes of the exposure region 22 and opening 16b are formed congruently. This is because, under the above-mentioned etching conditions, the majority of the plasma particles are bombarded or struck onto the protective film exposed region 10b from a direction substantially perpendicular to the principal surface 12a.

Further, 'plasma particles' indicates positive ions and radicals that constitute plasma.

However, due to the collisions among the plasma particles with residual gas particles in the etching chamber during the flight of the plasma particles, plasma particles whose trajectories vary slightly exist. The plasma particles whose trajectories vary slightly (referred to as 'peripheral bombardment plasma particles' or 'peripheral directed plasma particles' hereinbelow) are also directed and bombarded onto the protective film exposed region 10b outside the etching-destined region 18. As a result, as shown in FIG. 3, etching of the protective film 10 also advances in the peripheral region 18a of the etching-destined region 18.

Here, the peripheral region 18a indicates a region excluding the etching-destined region 18 from the protective film exposed region 10b in a planar view. That is, the peripheral region 18a has a ringlike planar shape that surrounds the exposure region 22 and is a region the outer circumference of which is restricted by the side 16a of the hole 16. In other words, the peripheral region 18a can also be said to be a region excluding the exposure region 22 from the region surrounded by the side 16a which is rendered by analogously enlarging the exposure region 22 in a planar perspective.

Further, the dose amount of peripheral bombardment plasma particles in the peripheral region 18a is abruptly reduced as the separation distance from the etching-destined region 18 increases. In addition, the amount of etching of the protective film 10 is proportional to the dose amount of the plasma particles at this point.

As a result, the cross-sectional shape of the protective film 10 in the peripheral region 18a reflects the dose amount distribution of peripheral bombardment plasma particles within the peripheral region 18a. That is, in the peripheral region 18a, the protective film 10 gradually thickens while curving gently with increased separation from the exposure region 22. That is, the cross-section of the protective film 10 of the peripheral region 18a has a shape such that the inclination of the outline 10d of the protective film 10 decreases as the distance from the exposure region 22 increases. In other words, the discontinuity of the height of the protective film 10, that is, the variation in the step shape, is suppressed at the boundary B between the exposure region 22 and peripheral region 18a.

Here, 'outline 10d' indicates a curve constituting a boundary between the hollow 16c and the protective film 10 in the section obtained by cutting the protective film 10 perpendicularly with respect to the principal surface 12a in the peripheral region 18a.

The width D of the peripheral region 18a, that is, the distance between the outer perimeter of the peripheral region 18a and the outer perimeter of the exposure region 22 is equal to the width L (See FIG. 1B) of the overhang above and is approximately 0.5 µm.

The peripheral bombardment plasma particles are directed substantially only to a region within the peripheral region 18a and therefore etching does not advance outside the peripheral region 18a, that is, in the region coated by the photoresist layer 14. Here, the unetched region outside the peripheral region 18a coated by the photoresist layer 14 is called the flat region 18b. In other words, the flat region 18b can also be said to be a region of the protective film 10, excluding the exposure region 22 and peripheral region 18a.

As mentioned earlier, although etching advances in the peripheral region 18a, etching does not advance in the flat region 18b. Accordingly, at the boundary between the peripheral region 18a and flat region 18b, a side wall 10c that extends substantially perpendicularly is formed by the protective film 10. The height of the side wall 10c, that is, the difference between the height of the flat region 18b and the height of the peripheral region 18a is approximately 50 nm.

Further, the first to third steps mentioned-above correspond to the etching method of the present invention.

Furthermore, a structure excluding the photoresist layer 14 from the structure 30, that is, a structure that comprises the substrate 12, protective film 10, exposure region 22, peripheral region 18a, and flat region 18b corresponds to the etching structure 60 of the present invention.

Fourth Step

Figure 1D:
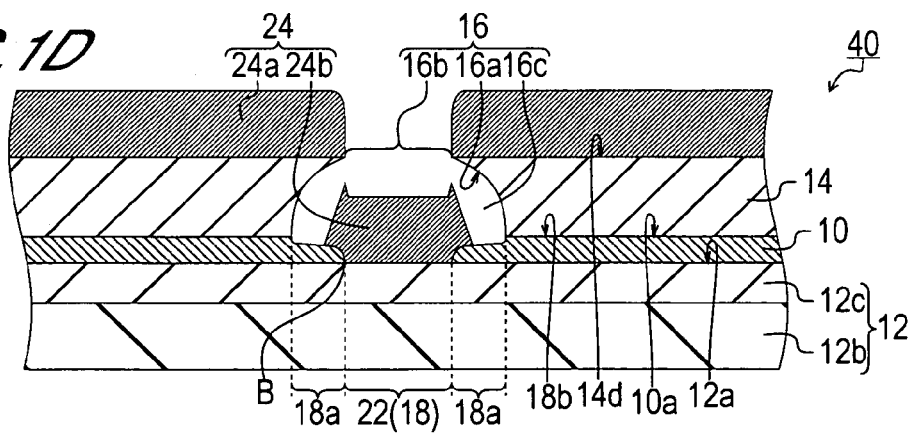
FIG. 1D is a view schematically showing a cross section of a structure obtained at a fourth step of the etching method of the first embodiment.

The structure 40 shown in FIG. 1D will be formed next. That is, a metal film 24 is deposited through vacuum deposition in a region beside the principal surface 12a of the structure 30 that includes the exposure region 22 with the photoresist layer 14 comprising the hole 16 serving as a mask. Here, the metal film 24 is a stacked film obtained by depositing an Ni film that is approximately 50 nm thick and an Au film that is approximately 0.5 µm thick in that order.

More precisely, vacuum deposition of the metal film 24 is performed after cleaning the structure 30 and then placing the structure 30 in a vacuum deposition apparatus (not illustrated). A crucible of an electron beam heating system is employed as the metal evaporation source. Further, the crucible is installed spaced apart from the substrate 12 to face the principal surface 12a of the substrate 12 which is attached to a support body (planetary). Thereupon, the crucible is located eccentrically with respect to the axis of rotation of the planetary. Thereafter, in a state where the magnitude of the vacuum in the film-forming chamber is held at approximately $7 \times 10^{-7}$ Torr, the metal film 24 is deposited by causing the metal in the crucible to evaporate while the planetary is rotated at a predetermined speed about the axis of rotation.

As a result, a metal film 24a is deposited on the upper surface 14d of the photoresist layer 14. Similarly, a metal film 24b is deposited on the exposure region 22.

Because the evaporation source is not regarded as a point evaporation source and the planetary is rotated and so forth, the metal atoms arriving in the hollow 16c after passing through the opening 16b not only include those which fly perpendicularly with respect to the principal surface 12a but also those which fly inclined with respect to the principal surface 12a.

However, the metal atoms that fly to the hollow 16c have a higher directivity than the peripheral bombardment plasma particles mentioned earlier and are deposited in a narrower range than the bombardment region of the peripheral bombardment plasma particles. This is due to the fact that the area of the evaporation source is smaller than that of the plasma generation region and the magnitude of the vacuum during vacuum deposition is smaller than the magnitude of the vacuum during ICP-RIE.

Accordingly, the metal atoms are deposited in a region that is wider than the exposure region 22 and narrower than the outer perimeter of the peripheral region 18a. That is, the metal film 24b is formed to coat not only the exposure region 22 but also a portion of the protective film 10 that exists in the peripheral region 18a.

In this embodiment, the metal film 24b overlaps the peripheral region 18a over a width of approximately 0.2 μm.

Furthermore, the metal film 24b is deposited in a cross-sectional trapezoidal shape in which the width narrows toward the top. This is because the metal film 24a is gradually deposited on the photoresist layer 14 constituting the periphery of the opening 16b as vacuum deposition. That is, as the vacuum deposition progresses, the thickness of the metal film 24a deposited on the periphery increases, as a result, the solid angle of the opening 16b is gradually reduced from an optional viewpoint on the exposure region 22. Accordingly, the range of the flight angle of the metal atoms capable of passing through the opening 16b is restricted as the vacuum deposition advances and, as a result, the metal film 24b is deposited in a cross-sectional trapezoidal shape.

Fifth Step

Figure 1E:
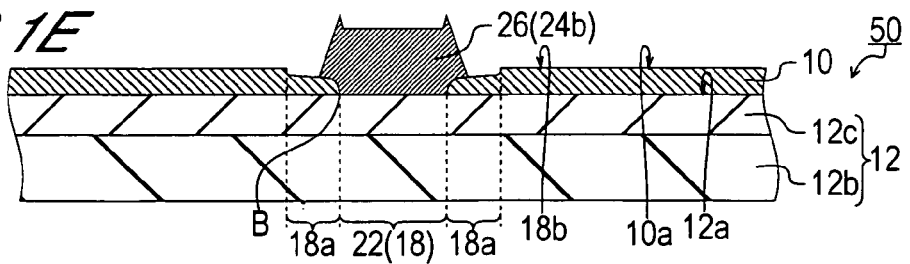
FIG. 1E is a view schematically showing a cross section of a structure obtained at a fifth step of the etching method of the first embodiment.

Finally, the structure 50 shown in FIG. 1E is formed. That is, the metal film 24a excluding the metal film 24b that exists in the hole 16 is removed together with the photoresist layer 14.

More precisely, the structure 40 is immersed in a dimethylformamide ((CH$_3$)$_2$ NCHO) solution. As a result, the photoresist layer 14 dissolves and is removed together with the metal film 24a deposited on the photoresist layer 14. As a result of the unnecessary metal film 24a being removed, a metal film structure 26 (metal film 24b) is residually formed on the exposure region 22.

Here, the metal film structure 26 represents various electrodes made of metal such as gate electrodes, and wiring and so forth, for example, that are used in semiconductor devices.

Figure 4:
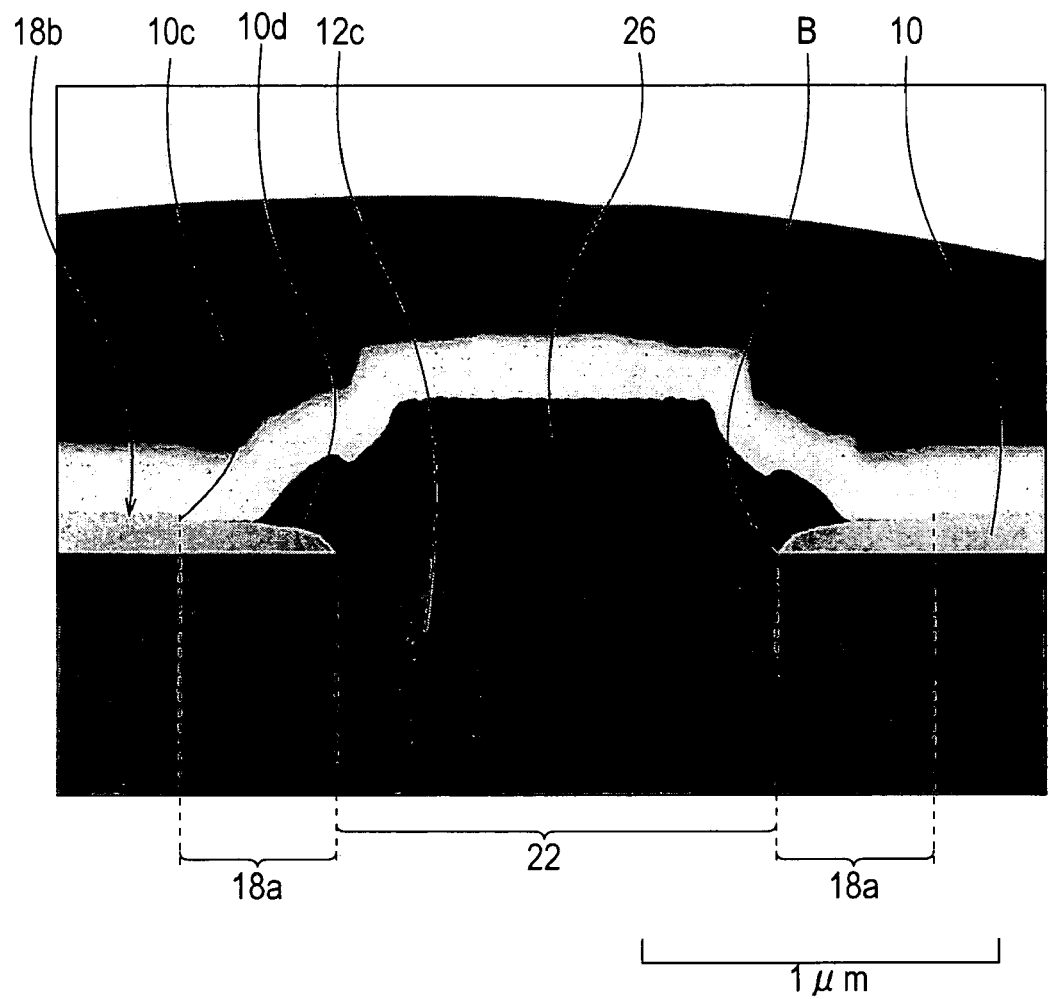
FIG. 4 is view showing a cross-section TEM photograph of a metal film structure (etching structure) of the first embodiment.
Figure 5A:
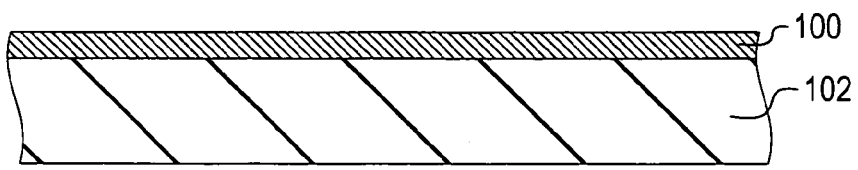
FIG. 5A is a view schematically showing a cross section of a structure obtained at a first step of the etching method of a conventional technique.
Figure 5B:
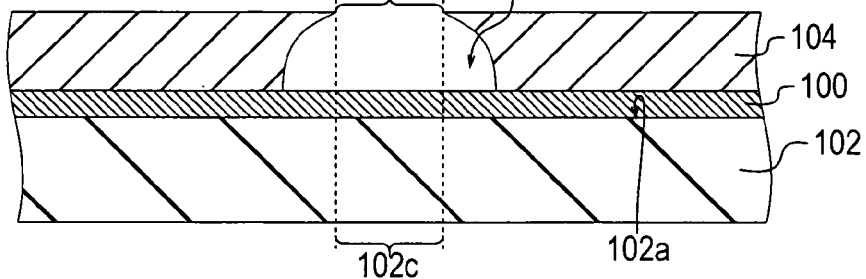
FIG. 5B is a view schematically showing a cross section of a structure obtained at a step that follows on from FIG. 5A.
Figure 5C:
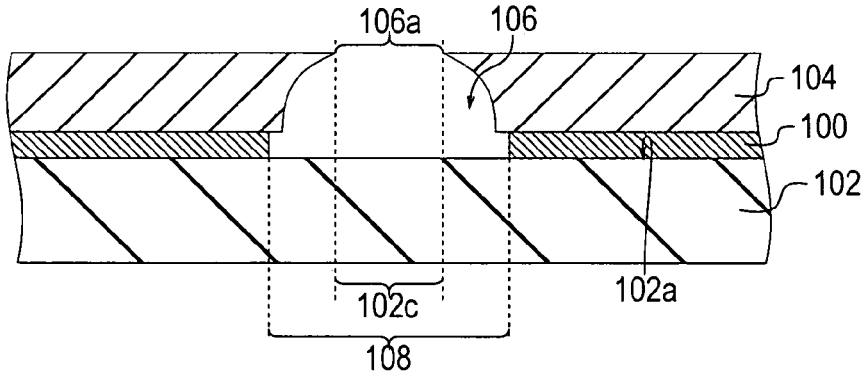
FIG. 5C is a view schematically showing a cross section of the structure obtained at a step that follows on from FIG. 5B.
Figure 5D:
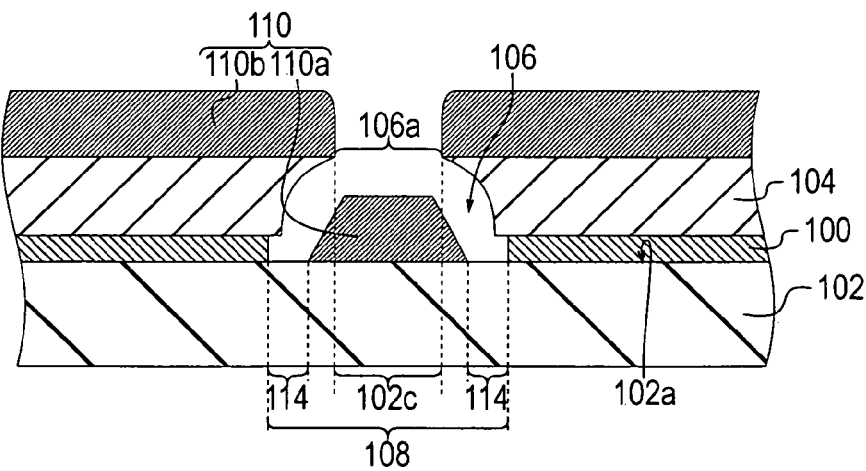
FIG. 5D is a view schematically a cross section of the structure of a step that follows on from FIG. 5C.
Figure 5E:
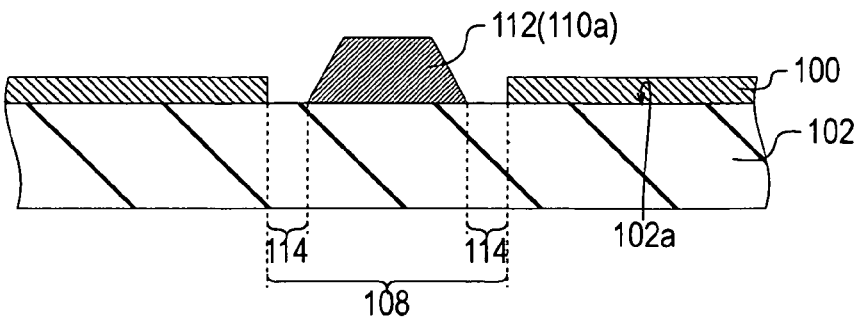
FIG. 5E is a view showing a cross section of the structure of a step that follows on from FIG. 5D.

FIG. 4 shows a cross-section TEM photograph of the metal film structure 26 (and etching structure 60) obtained in the course of the first to fifth steps.

The cross-section TEM photograph is observed by means of a scaling factor of 4000 times.

FIG. 4 shows the GaN layer 12c, the protective film 10, and the metal film structure 26 and so forth.

The cross-sectional trapezoidal-shaped black portion in the middle of FIG. 4 is the metal film structure 26. The white portion that extends so as to overlap the metal film structure 26 is the protective film 10. The gray portion that extends so as to touch both the bottom of the protective film 10 and the bottom of the metal film structure 26 is the GaN layer 12c.

As is evident from FIG. 4, it can be seen that any variation in the step-shaped height of the protective film 10 is suppressed at the boundary B between the exposure region 22 and peripheral region 18a. Further, it can be seen that, in the peripheral region 18a that has a width of approximately 0.5 μm, the film thickness of the protective film 10 gradually widens at increased distances from the exposure region 22. It is clear that the side wall 10c is formed on the protective film 10 at the boundary between the peripheral region 18a and the flat region 18b.

It can also be seen that the metal film structure 26 overlaps the peripheral region 18a over a width of approximately 0.2 μm. A nonuniform shade variation cannot be seen in the photographic image of the metal film structure 26 deposited over the boundary B. That is, it is clear that a step disconnection is not produced in the metal film structure 26.

Here, a 'step disconnection' indicates a phenomenon according to which, when metal is vacuum-deposited over a level difference, a gap is produced between the metal film that exists on the upper level of the step difference and the metal film that exists on the lower level of the step difference on account of the separate growth of the two metal film, whereby the electrical conductivity deteriorates.

Thus, in the etching method of this embodiment, the etching of the protective film 10 is performed by means of ICP-RIE of predetermined conditions in the third step. As a result, the plasma particles directed onto the protective film 10 via the opening 16b enter the protective film exposed region 10b substantially perpendicularly. Accordingly, the etching advances substantially only in the etching-destined region 18 with the planar shape that is congruent to the opening 16b. Hence, the side etching of the protective film 10 is suppressed.

Further, the etching method of this embodiment suppresses side etching by optimizing the ICP-RIE conditions. As a result, there is no need to add new steps in order to suppress side etching as is the case with conventional techniques.

Furthermore, according to the fabrication method of the metal film structure 26 of this embodiment, because the exposure region 22 is formed in a planar shape that is congruent to the opening 16b, the exposure region 22 and the peripheral protective film 10 can be coated by the metal film structure 26. As a result, the formation of the uncoated region 114 (FIG. 5) described in the related art is prevented. Hence, the contamination of the principal surface 12a that arrives in the uncoated region 114 and the production of surface charge are suppressed. Accordingly, a drop in the electrical characteristic of the semiconductor device that employs the metal film structure 26 as an electrode or wiring or the like can be suppressed.

Furthermore, because the fabrication method of the metal film structure 26 of this embodiment uses the above etching method, the etching of the protective film 10 also advances slightly in the peripheral region 18a. Accordingly, the height of the protective film 10 gently rises at the boundary between the exposure region 22 and peripheral region 18a. As a result, a step disconnection of the metal film structure 26 deposited at the boundary is suppressed.

Further, in the etching structure 60 of this embodiment, the inclination of the outline 10d of the cross-section of the protective film 10 is formed in the peripheral region 18a so as to decrease in accordance with the distance from the exposure region 22. That is, a step-shaped level difference does not exist at the boundary B between the exposure region 22 and the peripheral region 18a. As a result, when the metal film 24b is deposited in the exposure region 22 so as to partially coat the peripheral region 18a, a step disconnection is not produced at the boundary B between the exposure region 22 and peripheral region 18a.

Further, the etching structure 60 of this embodiment comprises a side wall 10c at the boundary between the peripheral region 18a and the flat region 18b. As a result, when an interlayer insulation film or the like is coated over the whole surface of the etching structure 60, the side wall 10c is able to exhibit an anchor effect and suppress film detachment of the interlayer insulation film.

Further, the substrate 12 is not limited to a stacked substrate of the sapphire substrate 12b and GaN layer 12c. An optionally preferred substrate can be used in accordance with the design such as an Si substrate or the like, for example.

In addition, the protective film 10 is not limited to a silicon nitride film and an optionally preferred film can be used in accordance with the design such as a $SiO_2$ film, for example. However, when the protective film is etched, the type of etching gas needs to be selected in accordance with the type of protective film.

Furthermore, the film thickness of the protective film 10 is not limited to 100 nm and can be an optionally preferred film thickness in accordance with the design.

The photoresist layer 14 is not limited to a negative-type photoresist. A positive-type photoresist that has been exposed and developed by using the image reverse method may also be used.

Further, the thickness of the photoresist layer 14 is not limited to 1 μm and can be an optionally preferred thickness in accordance with the design.

Further, the width W1 of the opening 16b is not limited to 1 μm and can be an optionally preferred width in accordance with the design in order to match the size of the formed metal film structure 26.

Furthermore, the width L of the overhang of the side 16a is not limited to 0.5 μm and can be an optionally preferred width in accordance with the design. However, the width L of the overhang is preferably a width that does not constitute an obstacle for the deposition of the metal film 24b. Hence, in the case of this embodiment, the width L of the overhang is preferably a wider width than the overhang width (approximately 0.2 μm) of the metal film 24b and peripheral region 18a.

Further, the vacuum deposition is not limited to an electron beam heating system. A well-known heating system such as a resistance heating system and high frequency heating system and so forth can be adopted.

In addition, the plasma used in the etching in the third step is not limited to ICP (inductively coupled plasma) and may also be plasma that is generated by ECR (electron cyclotron resonance).

Furthermore, the temperature of the substrate 12 during etching in the third step is not limited to 40° C. and may be any temperature that does not cause the photoresist layer 14 to be thermally deformed. For example, the temperature of the substrate 12 may be a temperature on the order of room temperature (approximately 25° C.) to 80° C.

Second Embodiment

The preferred etching conditions for the ICP-RIE in the third step of this embodiment will now be described.

The present inventors performed ICP-RIE of the substrate structure 20 by making a variety of modifications to the (1) ICP power, (2) RIE power and (3) pressure in the etching chamber.

As a result, it was clear that the etching rate was too high under the conditions used in conventional ICP-RIE (for example, ICP power: equal to or more than 1 kW and RIE power: equal to or more than 500 W) and it was difficult to control the shape of the exposure region 22 and peripheral region 18a, that is, the inclination of the outline 10d of the protective film 10 and the etching amount of the peripheral region 18a.

The present inventors discovered that the etching rate decreases and the shape of the exposure region 22 and the peripheral region 18a can be controlled, within the scope of the present invention, by reducing the ICP power and RIE power to approximately one tenth of the normal magnitudes.

Furthermore, the present inventors discovered that the etching rate of the protective film 10 mainly depends on the RIE power. Specifically, it was clear that the rate of change of the etching rate with respect to the rate of change in the ICP power is smaller than the rate of change of the etching rate with respect to the rate of change of the RIE power.

The ICP power is preferably 20 to 100 W. By making the ICP power equal to or more than 20 W, plasma particles in an amount permitting practical usage are generated in the etching chamber. As a result, the etching rate of the protective film 10 can be of a magnitude permitting practical usage.

Furthermore, by making the ICP power no more than 100 W, the amount of plasma particles generated in the etching chamber is not excessive. As a result, the etching rate of the protective film 10 is not excessive.

An ICP power of 30 to 80 W is preferable. Further, an ICP power of 40 to 60 W is more preferable. By limiting the ICP power to these ranges, the time required for etching of the protective film 10 can be shortened without sacrificing controllability of the shapes of the exposure region 22 and peripheral region 18a.

The RIE power relates to the amount of draw (dose amount) of plasma particles to the protective film 10 and to the incident energy of the plasma particles incident on the protective film 10.

The incident energy further relates to the inclination of the outline 10d of the cross-section of the protective film 10 in the vicinity of the boundary B (FIG. 3). That is, when the RIE power is increased, the incident energy increases and, therefore, the outline 10d in the vicinity of boundary B rises, that is, the inclination increases. On the other hand, when the RIE power is reduced, the incident energy decreases and, therefore, the outline 10d in the vicinity of the boundary B falls, that is, the inclination decreases.

The RIE power is preferably 5 to 50 W. By making the RIE power at least 5 W, plasma particles in an amount permitting practical usage can be bombarded onto the etching-destined region 18. Further, because the incident energy of the plasma particles is small, the damage produced in the exposure region 22 as a result of the collision of plasma particles can be reduced. In addition, the inclination of the outline 10d of the cross-section of the protective film 10 in the vicinity of the boundary B can be reduced and, therefore, the step disconnection in the vicinity of the boundary B can be suppressed when the metal film structure 26 is formed.

Moreover, by making the RIE power no more than 50 W, plasma particles in an amount sufficient for practical usage can be bombarded onto the etching-destined region 18. Further, the damage produced in the exposure region 22 as a result of the collision of plasma particles can be suppressed to an extent permitting practical usage. In addition, the inclination of the outline 10d of the cross-section of the protective film 10 in the vicinity of the boundary B can be of a magnitude that allows a step disconnection in the vicinity of the boundary B of the metal film structure 26 to be suppressed.

A RIE power of 10 to 30 W is preferable. In addition, a RIE power of 15 to 20 W is more preferable. By limiting the RIE power to these ranges, damage to the exposure region 22 can be suppressed and the etching rate can be of a magnitude sufficient for practical usage while the inclination of the outline 10d in the vicinity of boundary B can be kept at an angle such that a step disconnection of the metal film structure 26 is not produced.

The pressure in the etching chamber is preferably 1 to 100 mTorr. The pressure in the etching chamber relates to the amount of residual gas molecules in the etching chamber and collisions between the plasma particles and gas molecules increase as the pressure increases. As a result, the plasma particles whose trajectory changes in flight increase in quantity as the pressure increases. Therefore, the greater the pressure, the wider the range of irradiation of the plasma particles over the area of the protective film exposed region 10b. As a result, the greater the pressure, the smaller the inclination of the outline 10d in the vicinity of the boundary B.

By making the pressure in the etching chamber at least 1 mTorr, the inclination of the outline 10d in the vicinity of the boundary B can be kept at an angle preventing the occurrence of a step disconnection of the metal film structure 26. Further, by making the pressure in the etching chamber no more than 100 mTorr, excessive etching of the protective film 10 in the peripheral region 18a can be suppressed.

The pressure in the etching chamber is preferably 7.5 to 15 mTorr. By establishing the pressure in the etching chamber in this range, the inclination of the outline 10d in the vicinity of boundary B can be kept at an angle preventing the occurrence of a step disconnection of the metal film structure 26 while suppressing excessive etching of the protective film 10 of the peripheral region 18a.

Normal ICP-RIE is often performed under the condition "RIE power<ICP power". However, in the case of the present invention, there are no particular restrictions on the magnitude correlation between the RIE power and ICP power. Etching may also be performed under the condition "RIE power≧ICP power".

What is claimed is:

1. An etching method, comprising the steps of:
   preparing a substrate structure comprising a substrate, a to be etched film formed on the principal surface of said substrate, and an etching protection film formed on said to be etched film and having a hole formed therethrough;
   said hole being formed by an opening in the surface of said etching protection film and a hollow linked to said opening and reaching said to be etched film through said etching protection film;
   the planar shape of said opening being congruent to the planar shape of an etching-destined region of said to be etched film and a hole width of said hole widening toward said to be etched film in the depth direction from the surface of said etching protection film; and
   forming an exposure region in said principal surface of said substrate by removing, through inductively coupled plasma reactive ion etching under the following conditions, a to be etched film part existing in said etching-destined region of said to be etched film
   (1) ICP power has a value in the range of 20 to 100 W,
   (2) RIE power has a value in the range of 5 to 50 W, and
   (3) the pressure in an etching chamber has a value in the range of 1 to 100 mTorr.

2. The etching method according to claim 1, wherein said substrate is prepared as a substrate having a GaN layer on the principal surface side thereof; said to be etched film is formed as a silicon nitride film; said etching protection film is formed as a negative-type photoresist layer; and the etching gas of said inductively coupled plasma reactive ion gas is $SF_6$.

3. The etching method according to claim 2, wherein the ICP power has a value in the range of 30 to 80 W.

4. The etching method according to claim 2, wherein the ICP power has a value in the range of 40 to 60 W.

5. The etching method according to claim 2, wherein the RIE power has a value in the range of 10 to 30 W.

6. The etching method according to claim 2, wherein the RIE power has a value in the range of 15 to 20 W.

7. The etching method according to claim 2, wherein the pressure in said etching chamber has a value within the range of 7.5 to 15 mTorr.

8. The etching method according to claim 2, wherein, when said to be etched film part is removed, the etching time of the inductively coupled plasma reactive ion etching is a time permitting removal of a film thickness corresponding to 1.5 times the film thickness of said to be etched film.

9. The etching method according to claim 2, wherein the width of the interval between the etching-destined region and said exposure region is no more than 0.1 μm.

10. The etching method according to claim 2, wherein said substrate is prepared as a substrate having a sapphire substrate and a GaN layer thereon.

11. The etching method according to claim 2, wherein the temperature of said substrate during implementation of the inductively coupled plasma reactive ion etching is set to a temperature at which the etching protection film is not thermally deformed.

12. The etching method according to claim 11, wherein said temperature of said substrate has a value within the range of 25 to 80° C.

13. A method of fabricating a metal film structure by using the etching method according to claim 1, comprising the steps of:
   after forming said exposure region,
   depositing a metal film by means of vacuum deposition in a region on the side of said principal surface of said substrate including the exposure region, with said etching protection film serving as a mask; and
   removing a metal film part outside said hole of said metal film together with said etching protection film.

14. The method of fabricating a metal film structure according to claim 13, wherein, in the step of depositing said metal film, said substrate is rotated eccentrically with respect to an evaporation source that causes the source material of the metal film to evaporate.

15. The method of fabricating a metal film structure according to claim 13, wherein said metal film is deposited on said exposure region and on the surface of said to be etched film in the periphery of said exposure region.

16. The method of fabricating a metal film structure according to claim 13, wherein, in said vacuum deposition, metal atoms constituting said metal film are made to fly to said exposure region via said opening with a higher directivity than the plasma particles of the inductively coupled plasma reactive ion etching.

17. The method of fabricating a metal film structure according to claim 13, wherein said metal film is formed as a stacked film obtained by depositing an Ni film and an Au film, in that order.

18. The method of fabricating a metal film structure according to claim 13, wherein, when the metal film part outside the hole of said metal film is removed together with said etching protection film, said substrate having said metal film deposited on the principal surface side thereof is immersed in a solvent to dissolve said etching protection film.

* * * * *